United States Patent [19]

Burne, III et al.

[11] 4,406,923

[45] Sep. 27, 1983

[54] AUTOMATIC LOUDNESS CONTROLLER

[75] Inventors: John C. Burne, III; Emil L. Torick, both of Darien, Conn.

[73] Assignee: CBS Inc., New York, N.Y.

[21] Appl. No.: 315,841

[22] Filed: Oct. 28, 1981

[51] Int. Cl.³ .............................................. G01H 5/00
[52] U.S. Cl. ................... 179/1 VL; 179/1 F; 330/103
[58] Field of Search ............ 179/1 VL, 15.55 R, 1 P, 179/1 F; 330/103

[56] References Cited

U.S. PATENT DOCUMENTS 3,582,964 6/1971 Torick et al. ................... 179/1 VL
3,594,506 7/1971 Bauer et al. ........................ 179/1 P Primary Examiner—A. D. Pellinen
Assistant Examiner—James L. Dwyer
Attorney, Agent, or Firm—Spencer E. Olson

[57] ABSTRACT

The herein-described broadcast apparatus for controlling the loudness level of program signals includes a variable gain device for increasing or decreasing the level of incoming program material as a function of program loudness while simultaneously holding the output level below a preset level to assure proper modulation levels and/or to prevent excessive reaction by peak limiters which usually follow the loudness controller in the broadcast chain.

8 Claims, 5 Drawing Figures

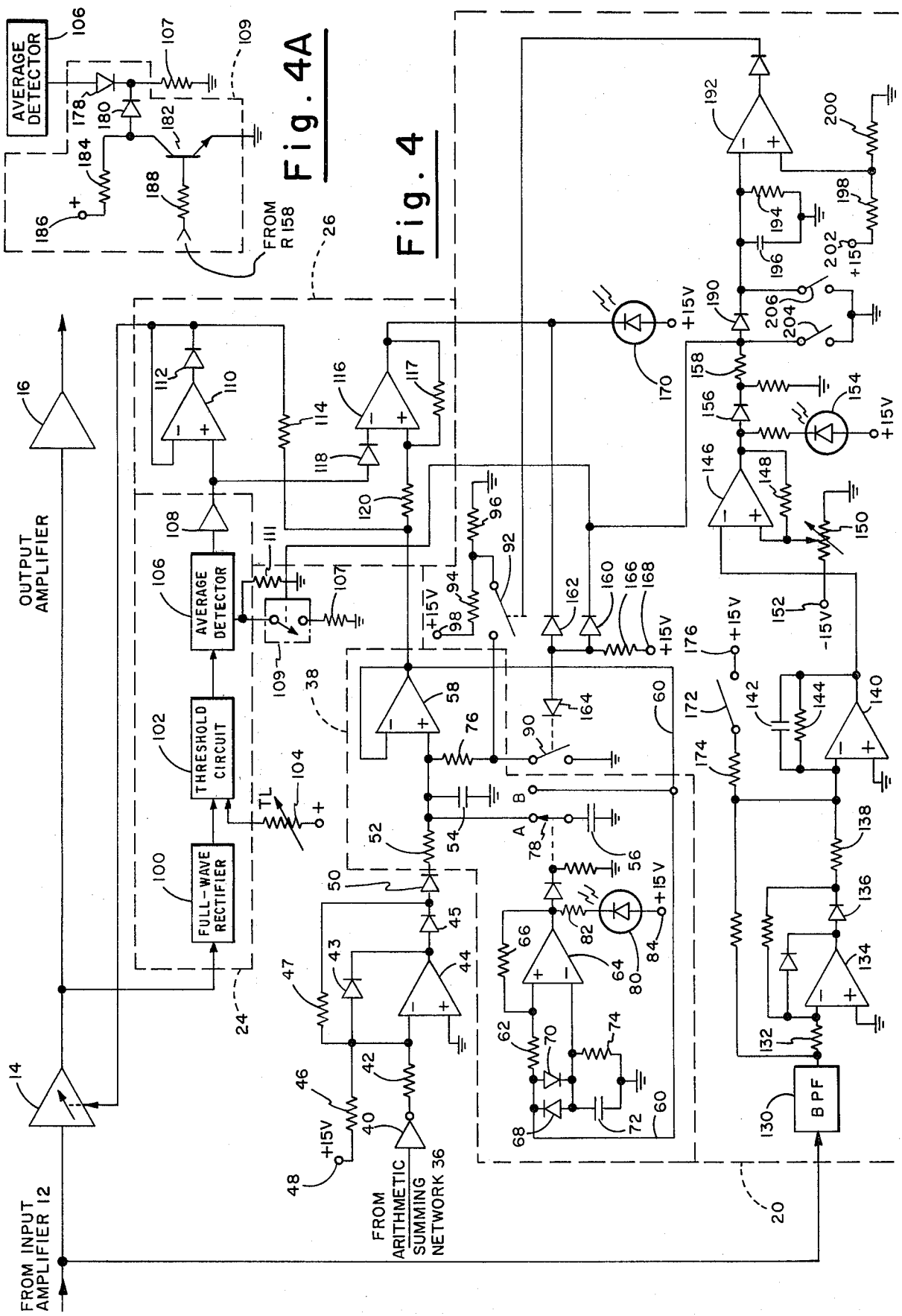

AUTOMATIC LOUDNESS CONTROLLER

BACKGROUND OF THE INVENTION

This invention relates to devices for controlling loudness and, more particularly, to a new and improved apparatus for automatically providing a uniform average loudness level of broadcasting and like sound signals.

Commonly assigned U.S. Pat. No. 3,594,506 entitled "Loudness Level Indicator," the disclosure of which is hereby incorporated herein by reference, describes a loudness level indicator for accurately monitoring audio loudness levels, which includes an equalization network to which broadcasting and like signals are applied, the equalization network having a transfer characteristic which is inversely proportional to a 70 phon equal loudness contour, representative of the loudness levels of sounds as a function of frequency for sound pressure levels ranging from about 60 db to about 80 db. The system includes eight octave band filters which separate the equalized signals into frequency bands covering the entire audio range, which because of the equalization network provide bands of sound of equal loudness as output signals having equal amplitudes. The separated signals are rectified and linearized and then combined linearly in a signal combining network. The combined signal is applied through a ballistics compensation network to an indicating instrument which provides a visual indication of the amplitude of the combined signal.

The loudness research reported in the aforementioned patent and the experience gained in the design of the loudness level indicator were embodied in a system described in commonly assigned U.S. Pat. No. 3,582,964 entitled "Automatic Loudness Controller," the disclosure of which is hereby incorporated herein by reference, for automatically controlling the loudness levels of broadcast sounds. This device, which has been used with success for over a decade, and was designed to be used as the final variable gain device in an audio broadcast chain (i.e., at the transmitter) is solely a loudness limiter; that is, it reduces the level of the signal if it senses that the signal going through, although at correct modulation, is possibly too loud. The device is not capable of raising the signal level and consequently cannot affect the carefully controlled limits on the 100% modulation.

Experience with this earlier automatic loudness controller has shown that control of loudness might better be done in the broadcast studio than at the transmitter, at or near the end of the audio broadcast chain; that is, it is more convenient to establish correct loudness levels in the studio and then transmit the processed signal by telephone line or microwave link to the transmitter site. However, since the broadcast chain traditionally includes a peak limiter as the final element, even if correct loudness levels were established at the studio, this peak limiter might very well defeat these carefully established loudness levels, particularly if low frequency signals were brought up to be equally loud to earlier-processed high frequency signals; that is, if the loudness controller tried to raise the loudness level of an essentially low frequency passage so as to have a loudness equal to previous program material consisting essentially of higher frequencies, the peak limiter would recognize a potential for overmodulation and reduce the level of the low frequency passage, and thus effectively defeat the action of the loudness controller. This result is satisfactory in the sense that compliance with FCC standards is assured, but the operator loses aesthetic control over the signal ultimately broadcast because of another automatic device (i.e., the peak limiter) which operates contrary to the intended purpose of the loudness controller. It would be much better to have all of the control functions embodied in one device capable of analyzing these opposing criteria, namely, loudness level and signal level, and making a single gain-adjustment decision; that is, if analysis of the potential loudness of the signal indicates a possibility of its over modulating, if the gain of the signal is controlled on the basis of signal level rather than loudness the possibility of the final peak limiter being called upon to limit the signal before it is broadcast would be essentially eliminated.

SUMMARY OF THE INVENTION

Accordingly, it is an object of the present invention to provide improved broadcast apparatus for automatically controlling the loudness level of broadcasting and like sounds while simultaneously limiting output signal level to a preset maximum to assure proper modulation levels and/or to prevent excessive reaction by later-following peak limiters.

Briefly, the apparatus of the present invention automatically controls the overall loudness range of broadcasting and like sounds by raising the level of moderately quiet passages and reducing the level of loud passages, and, additionally, includes level-controlling circuitry for holding the output level below a preset limit. In a particular embodiment of the invention, signals corresponding to the program material are applied to an audio signal path including a voltage controlled amplifier. An analysis of program loudness is made by supplying the amplified signals to loudness measuring circuitry which includes a plurality of filter networks for separating the signals into different frequency bands, means for rectifying and linearly combining the separated signals, and means for compensating the combined signal by a ballistics compensation network which approximates the ballistic response of the ear; the output of the loudness control circuit is a DC voltage of amplitude proportional to loudness. Signal level is analyzed by applying the same amplified signals to a level sensing circuit which limits the maximum amount of gain which can be contributed by the loudness control circuit, which limit being a function of the loudness-to-level ratio of the signal. A control logic circuit connected to receive the outputs of the loudness control circuit and the level control circuit decides which circuit—loudness or level—should be in control and connects the appropriate section to the voltage controlled amplifier. The control logic also interfaces with a gain hold circuit, which inhibits any gain increase during a program lapse, or during a period of low-level background effects, and to lock the gain of the loudness control section whenever the level control section is in control.

Other objects, features and advantages of the invention will become apparent, and its construction and operation better understood, from the following detailed description read in conjunction with the accompanying drawings.

BRIEF DESCRIPTION OF THE DRAWING

In the Drawings:

FIG. 4 is a diagram, partly schematic and partly in block form, of an illustrative implementation of the system of FIG. 1; and FIG. 4A is a circuit diagram of a portion of the system shown in FIG. 4.

DESCRIPTION OF THE PREFERRED EMBODIMENT

Figure 1:
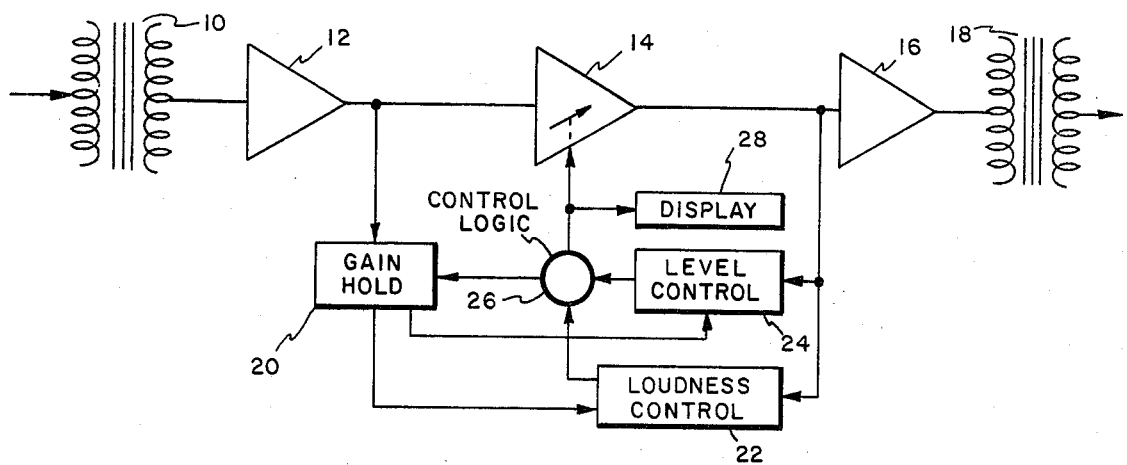
FIG. 1 is a block diagram of apparatus according to the present invention for controlling the loudness level of sounds.

In the illustrative embodiment of the invention shown in FIG. 1, intended for use in a broadcast studio rather than at the transmitter site, AC voltage signals corresponding, for example, to a broadcast message are applied via a transformer 10 to an active buffer stage 12 which presents a balanced load, typically 150 or 600 ohms, to the line. The gain of this buffer stage is adjustable and is used in the calibration of the system. Inasmuch as the apparatus is intended to be used in the studio, the loudness controller is designed to take into account the fact that in all likelihood it will be followed in the broadcast chain by a modulation limiter in the transmitter. The output from the input stage is applied to a variable gain device, such as a voltage controlled amplifier 14, which adjusts the gain applied to signals processed by the unit. The output of amplifier 14 is applied to an output stage, which includes an amplifier 16 which drives an output transformer 18. The single-ended input to amplifier 16 preferably is converted to a double-ended output for differentially driving the output transformer.

Control of the gain of amplifier 14 is achieved by the coaction of (1) a gain-hold circuit 20 responsive to the input signal to amplifier 14 for inhibiting gain changes when the input signal falls below a preset level; (2) a loudness control circuit 22 operative in response to the output signal from amplifier 14; (3) a level control circuit 24; and (4) a combinational logic circuit 26 for determining which section—loudness or level—should be in control, and which connects the appropriate section to the voltage controlled amplifier 14. The logic also interfaces with gain-hold circuit 20 to lock the gain of loudness control circuit 22 whenever the level control section 24 is in control, and to lock the gain of level control 24 when the amplitude of the input signal falls below a predetermined level. The apparatus also includes a front panel mounted display 28, for indicating the relative gain applied by the unit.

Figure 2:
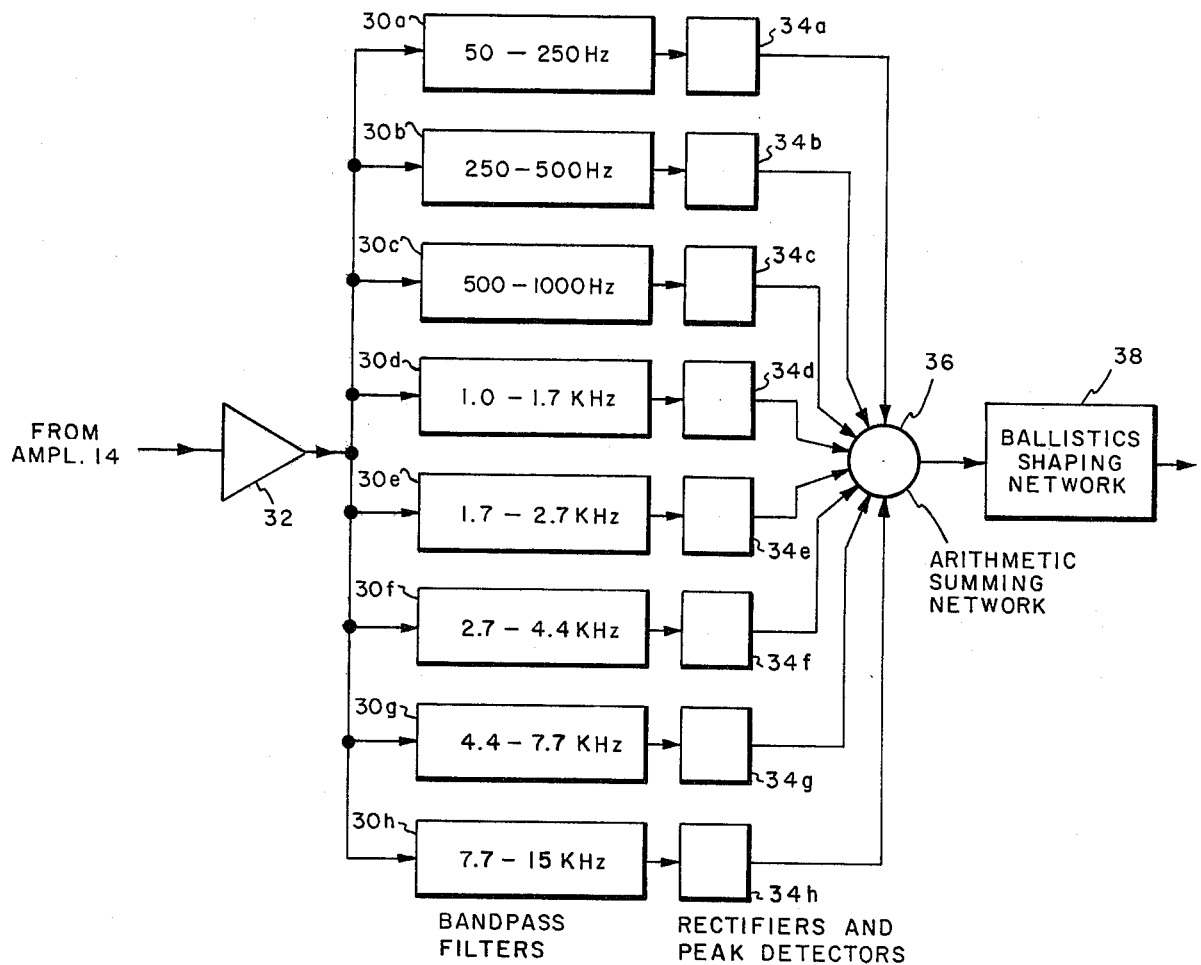
FIG. 2 is a block diagram of the principal elements of the loudness control section of the system of FIG. 1.

The heart of loudness control circuit 22 is the arrangement shown in FIG. 2 which applies a loudness algorithm to the output signal. This circuit, which is similar to that used in the loudness indicator described in the aforementioned U.S. Pat. No. 3,594,506, takes into account the frequency content of the signal, the signal bandwidth, and signal dynamics. As stated in this earlier patent, the relationship between frequency content and loudness has been known for many years. Fletcher and Munson first published their classical equal-loudness contours in 1933; many other researchers have generated their own contours, all with slight differences; and, applicants and their colleagues have developed a contour under simulated home-listening conditions at a level of 70 phons. The contour used in the present controller is shown in the upper portion of FIG. 3; this contour is achieved by adjusting the relative amplitudes of the eight bandpass filters of the circuit of FIG. 2, as will presently be explained in greater detail.

Research has shown that a "summation effect" occurs in the human ear which results from the fact that two (or more) simultaneous stimuli with given independent loudnesses which are widely spaced in frequency will sound louder than if similar stimuli were very close in frequency. This factor is taken into account in the loudness control circuit 22 by dividing the audio spectrum into "critical bands," a critical band being that maximum bandwidth below which loudness does not diminish as the spectral distribution of the signal is decreased. While there are actually twenty-four "critical bands" within the broadcast bandwidth of 50 Hz to 15 KHz, the cost and complexity of twenty-four bandpass filters has been avoided, while still obtaining acceptable results, by combining three adjacent critical band filters into each of eight broader filters 30a–30h, which separate the signals from amplifier 14 applied thereto (via a buffer amplifier 32) into frequency bands covering substantially the entire audio range. In particular, filter circuit 30a is responsive to signals having frequencies between about 50 and 250 Hz, filter circuit 30b is responsive to signals having frequencies between 250 and 500 Hz, filter circuit 30c is responsive to signals having frequencies between 500 and 1000 Hz, filter 30d is responsive to signals having frequencies between 1.0 and 1.7 KHz, filter 30e is responsive to signals having frequencies between 1.7 and 2.7 KHz, filter circuit 30f is responsive to signals having frequencies between 2.7 and 4.4 KHz, filter 30g is responsive to signals having frequencies between 4.4 and 7.7 KHz, and, finally, filter 30h is responsive to signals having frequencies between 7.7 and 15 KHz. In a successfully operated embodiment, filters 30b–30g are symmetrical bandpass filters, with six poles of filtering on each skirt; filter 30a is a six pole low-pass filter with four poles at high-pass; and filter 30h is a six pole high-pass filter with two poles of low-pass. The frequency response of the individual filters is shown in the lower portion of FIG. 3.

Figure 3:
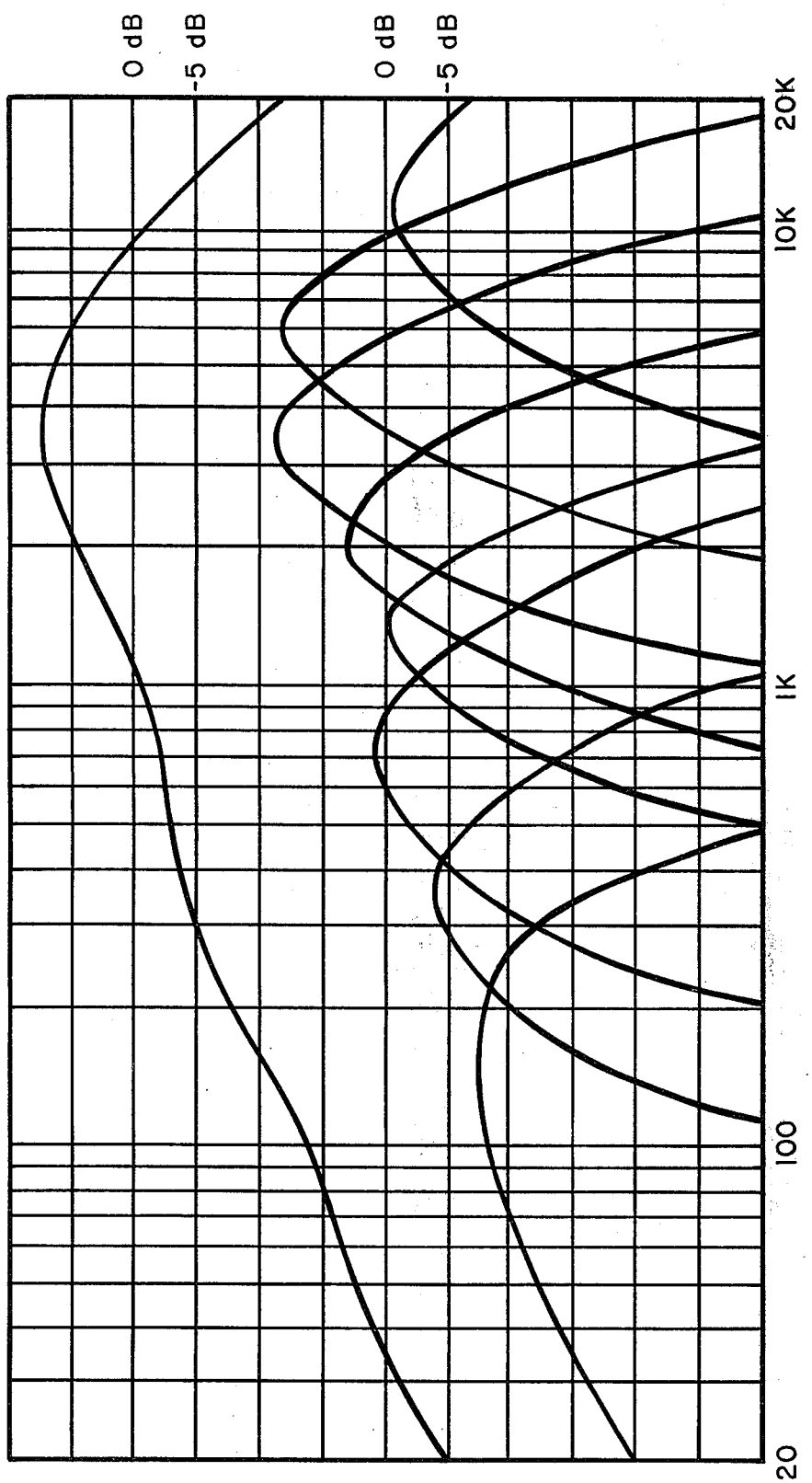
FIG. 3 is a graphic representation in logarithmic coordinates of the response characteristics of the bank of filters shown in FIG. 2, and of the transfer function of the loudness contour used in the apparatus of FIG. 1.

The output of each bandpass filter is applied to a respective rectification and level detection circuit 34a–34h, each of which performs full-wave rectification and also scales the amplitude of the output of its respective filter, this amplitude scaling determining the frequency contour of loudness sensing shown in the upper portion of FIG. 3. Each of circuits 34a–34h also includes means for transforming the scaled, rectified signal into a DC voltage; typical detection time constants are 25 milliseconds attack and 50 milliseconds decay. The DC output of each of the channels is applied to, and added arithmetically by a summation network 36 thereby to simulate the "summation effect" described earlier. The resulting voltage is fed into a time constant network 38 which approximates the ballistic response of the human ear. Tests by applicants and their colleagues have shown that these ballistics can be characterized by attack and decay time constants of approximately 75 milliseconds and 300 milliseconds, respectively, which are achieved with an RC network, an embodiment of which is shown in FIG. 4. The DC voltage from summing network 36 is first unity-gain inverted by an inverter 40 and then applied via a resistor 42 to the negative input terminal of an amplifier 44, connected to function as a threshold circuit, the threshold level being preset by a resistor 46 connected between the negative input terminal and a source of positive potential, typically 15 volts, represented by terminal 48. A diode 43 connected between the negative input terminal and the output terminal of amplifier 44, a diode 45 connected to the output terminal, and a resistor 47 connected in parallel with the series-connected diodes, together prevent any signals below the threshold from being passed on.

The output from the threshold circuit is applied through a diode 50 to the time constant circuit 38, the attack time constant of which is determined by the value of a resistor 53 times the sum of the capacitance values of a pair of capacitors 54 and 56, which are normally connected in parallel from one terminal of resistor 52 to ground. The value of these components are such that the attack time constant of the network is always 75 milliseconds, but its release time is automatically controllable as a function of program material so as to keep the audible effect of gain changes to a minimum, yet allow a fast gain increase when necessary. Specifically, the time constant circuit has a dual-release time constant, based on the fact that on the majority of program material a slow release time gives the most satisfactory audible results, while under certain conditions, such as when input loudness drops suddenly and the controller must increase gain quickly, a much faster release time is called for. Describing the action of this dual-time constant network in greater detail, the present value of the control voltage established by $R52 \times (C54 + C56)$ is coupled by a non-inverting unity gain buffer amplifier 58, a conductor 60 and a resistor 62 to the positive input terminal of an amplifier 64 having a feedback resistor 66 connected between its output terminal and its positive input terminal. Conductor 60 is connected to the negative input terminal of amplifier 64 via a pair of parallel-connected, oppositely-poled diodes 68 and 70, and the negative input terminal of the amplifier is also connected to ground through a network consisting of a capacitor 72 connected in parallel with a resistor 74, typically having values of 2.2 microfarads and 2.2 megahoms, respectively. The described circuit functions continuously to compare the present value of the control voltage appearing at the output of amplifier 58 with its immediately preceding value; if the circuit detects that the control voltage has been decaying for a predetermined amount of time determined by the product of the value of a resistor 76 connected to the positive input terminal of amplifier 38 times the sum of the capacitances of capacitors 54 and 56 (i.e., $R76 \times (C54 + C56)$ as compared to the time constant of $R74 \times C72$, the output of comparator 64 goes negative and actuates a switch, schematically shown at 78, from its illustrated position at contact A to its contact B, thus switching capacitor 56 out of the release time-constant network. When the control voltage has reached its desired level the comparator circuit actuates switch 78 to switch capacitor 56 back into the RC network. A light-emitting diode 80 connected in series with a resistor 82 between a source of positive potential represented by terminal 84, typically 15 volts, and the output terminal of comparator 64 is illuminated during the fast-decay mode of the time constant network.

It is seen that resistor 76 is connected to the contactor of a switch, schematically shown at 90, whose contact is connected to ground, and also to the contact of a second switch 92, the contactor of which is connected to a voltage divider consisting of a pair of resistors 94 and 96 connected in series between a source of positive potential, represented by terminal 98, and ground. These switches, which are actually suitable electronic switches, are part of the gain-hold circuit 20, the operation of which will be described later; suffice it to say for now that when switch 90 is in the illustrated opened position there is no discharge path for capacitors 54 and 56, thereby to hold the control voltage at its present value. The loudness control voltage, appearing at the output of amplifier 58, is applied to the control logic 26, the operation of which will be described later.

In order to satisfy the strict limitations imposed by the Federal Communication Commission on modulation levels, and at the same time satisfy the broadcaster's desire to maintain as high a program power output as possible, the loudness controller according to the invention limits the maximum amount of gain that can be contributed by loudness control section 22 as a function of the loudness-to-level ratio of a signal. To explain, if a low-loudness, high-level signal were presented to a loudness controller which had no form of level control, the controller would increase gain as much as necessary to bring the signal up to the correct loudness level; the resultant increase in level would probably overdrive the peak limiter at the transmitter. The provision of a level-controlling circuit enables restriction of the maximum output level to a known, finite upper limit, adjustable by the broadcaster, in the studio.

The level control circuit 24 is driven by the output of voltage controlled amplifier 14 and includes a full wave rectifier 100, a threshold circuit 102 which performs a threshold function on the rectified signal, allowing only that portion of the signal above a threshold level, TL, established by adjustment of a potentiometer 104 connected to a source of potential, to be passed to an average detector 106. After removal of any low frequency ripple, this DC signal is amplified by an amplifier 108 to produce a level control signal, which is also applied to control logic circuit 26.

The function of the control logic is to decide whether loudness control circuit 22 or level control circuit 24 should be in control of amplifier 14, and to apply the appropriate control signal to the amplifier. To achieve these two functions, an amplifier 110 whose output is connected through a diode 112 to its negative input terminal so as to operate essentially as an ideal diode, connects the greater of two voltages, either the loudness control voltage appearing at the output of amplifier 58 and applied to the negative input terminal of amplifier 110 via a resistor 114, or the level control voltage appearing at the output of amplifier 108 and applied to the positive input terminal of amplifier 110, to the voltage controlled amplifier 114. Simultaneously, an amplifier 116 which has its output terminal connected via a resistor 117 to its positive input terminal, compares the level control signal applied to its negative input terminal via a diode 118, with the loudness control signal applied to its positive input terminal via a resistor 120, and produces a $-15$ volt output when the level control voltage is the greater. This enables gain-hold circuit 20 so as to preclude the loudness control section from attempting to increase the gain when, as has just been explained, the level control section has determined the undesirability of a further increase in gain.

The function of gain-hold circuit 20, which works off the input signal to amplifier 14, is to inhibit any gain increase during a program lapse, or during a period of low-level background effects. The inhibit threshold level is set high enough to prevent noise and background sounds from causing a gain increase, but low enough to allow the controller to react if the input level drops suddenly. More specifically, the input signal is subjected to a mild amount of frequency contouring by a bandpass filter 130 to make the gain-hold circuit less sensitive to noise. In a satisfactorily operated embodiment the −3 db points of the response characteristic of filter 130 are at approximately 250 Hz and 700 Hz. The signal from filter 130 is applied via a resistor 132 to the negative input terminal of an amplifier 134, the ouput of which is coupled via a diode 136 and a resistor 138 to the negative input terminal of an amplifier 140, the output terminal of which is connected to the negative input terminal by a network consisting of a capacitor 142 connected in parallel with a resistor 144, and also to the negative input terminal of an amplifier 146. Amplifiers 134 and 140 and their associated circuit components together form a full-wave rectifier, capacitor 42 smoothing the output of amplifier 140 to a DC value proportional to the level of the input signal. The output terminal of amplifier 146 is connected via a resistor 148 to its positive input terminal, the latter also being connected to a potentiometer 150 connected between a source of negative potential represented by terminal 152, typically having a value of 15 volts, and ground; the setting of potentiometer 150 sets the inhibit threshold. Together amplifiers 134 and potentiometer 150 and their associated circuit components comprise a full-wave rectifier/level detector having time constants determined by resistor 144 and capacitor 142, which typically have values of 750K ohms and 0.02 microfarads, respectively.

Amplifier 146 functions as a comparator which compares the output of level detector 140 with a reference voltage set by potentiometer 150, the arrangement being such that when the level detector output falls below the reference voltage the output of amplifier 146 goes low, indicating a "gain-hold" condition. This low voltage causes a light-emitting diode 154 to be energized and thereby display the "gain-hold" condition, and is also applied via a diode 156 and a resistor 158 to a diode OR gate consisting of three diodes 160, 162 and 164 having their anodes connected together and through a resistor 166 to a source of positive potential represented by terminal 168, typically having a value of 15 volts; the OR gate is operative in response to a voltage "low" at the output of amplifier 146 to open switch 90, thereby to prevent the loudness control voltage from decaying. The other input to the OR gate is a voltage low which appears at the output of amplifier 116, a condition which occurs when the level control section 24 is in command; this is another situation when the loudness control voltage should not be allowed to decay. Upon occurrence of the latter condition, another light-emitting diode 170 is energized and indicates to the operator that level control section 26 is in control of amplifier 14. The gain-hold operation may be manually inhibited by closing a switch 172, which connects the negative input terminal of amplifier 140 through a resistor 174 to a source of positive potential represented by terminal 176, typically having a value of 15 volts.

As was noted earlier, gain hold circuit 20 also locks the gain of the level control section 24 when the level of the input signal falls below a predetermined level. This is accomplished by disconnecting resistor 107 which provides the primary control of the the discharge of a storage capacitor in the average detector 106 by opening a switch, schematically shown at 109, and causing a resistor 111, having a much larger resistance than resistor 107, to constitute the discharge path and provide a high resistance leakage path through which the storage capacitor can discharge very slowly so as to preclude the controller becoming locked in a state of high gain reduction. Switch 109, a particular implementation of which is shown in FIG. 4A, is opened when the input to the controller falls below the aforementioned predetermined level, and the voltage at the output of comparator 146 goes low. The described switching function is achieved in an operative embodiment with the circuit shown in FIG. 4A, which includes a diode 178 connected to one terminal of the storage capacitor (not shown) of the average detector 106 and in series with resistor 107 to ground. An additional diode 180 has its anode connected to the anode of diode 178 and its cathode connected to the collector electrode of a transistor 182, the collector also being connected through a resistor 184 to a source of positive potential, typically 15 volts, represented by terminal 186. The emitter electrode is connected to ground, and the output terminal of resistor 158 (in the gain hold circuit) is connected through a resistor 188 to the base electrode. When the input signal to the amplifier is above the threshold level, that is, when the voltage at the output of comparator 146 is high, transistor 182 will be conducting, thereby reverse-biasing diode 180, and providing a discharge path through diode 178 and resistor 107. However, should the input signal level fall below the threshold level so as to cause the voltage at the output of comparator 146 to go low, transistor 182 will be turned off, causing diode 180 to be forward-biased and diode 178 to be reverse-biased, thus disconnecting the discharge path through resistor 107. As long as this condition prevails, the storage capacitor in average detector 106 will have no discharge path through resistor 107 and the gain control voltage produced by level control section 24 will remain constant. However, there will be leakage current through large-valued resistor 111 sufficient to very slowly discharge the storage capacitor, and thereby prevent the controller from becoming locked in a state of high gain reduction.

The gain hold circuitry 20 additionally includes a "return-to-zero" feature, provided by a diode 190 for coupling the output of level detector 146 to the negative input terminal of an amplifier 192 connected as a comparator, a network consisting of a resistor 194 and a capacitor 196 connected in parallel between the negative input terminal of comparator 192 and ground, and a voltage-dividing network comprising resistors 198 and 200 connected between a source of positive potential, represented by terminal 202, and ground for applying a positive potential to the positive input terminal of comparator 180. When gain-hold is activated, capacitor 196, typically having a value of 2.2 microfarads, starts discharging from its normal +15 volts through resistor 194, typically having a value of 15 megohms, and if gain-hold stays activated for 30 consecutive seconds, capacitor 196 will decay below a reference voltage set by resistors 198 and 200 and the output voltage of comparator 192 will go high. This voltage high closes switch 92, which applies a positive potential to capacitors 54 and 56 thereby to slowly return the gain of the controller to the mid-point of the control range, to await resumption of program material; when program material returns, comparator 192 resets instantly, opening switch 92.

A pair of electronic switches of the same type as switches 90 and 92, schematically shown at 204 and 206 and respectively connected from the cathode and anode of diode 190 to ground, are closed when a front panel switch (not shown) is placed in the TEST position; this immediately opens switch 90 and closes switch 92 to ensure that controller gain will be at mid-point when the front panel switch is returned to its NORMAL position.

It will now be apparent that the controller according to the invention improves upon the performance of loudness controller of U.S. Pat. No. 3,582,964 in that it responds to both the level and the loudness of the audio signal being processed. The controller increases or decreases the level of incoming program material to maintain uniform average loudness while simultaneously holding the output level below a preset limit to assure proper modulation levels, and to prevent excessive reaction by peak limiters which may (and traditionally do) follow the loudness controller. Under normal conditions the controller will cause some loss in modulation level during loud program segments; however, this is permissible under current FCC regulations which require that modulation levels be "usually not less than 85% on peaks of frequent recurrence, but where necessary to avoid objectionable loudness, modulation may be reduced to whatever level is necessary."

Although the invention has been described herein with reference to a specific embodiment, and to a specific use, many modifications and variations therein will readily occur to those skilled in the art. For example, it will be recognized that the level control circuit can be designed with other than broadcast modulation limits in mind; e.g., overload characteristics of disc or magnetic tape recording systems. Accordingly, all such variations and modifications are included within the intended scope of the invention as defined by the following claims.

We claim:

1. Apparatus for automatically controlling the level of audio frequency program signals to maintain uniform average loudness of sounds corresponding to said signals while simultaneously holding the signal level below a preset limit, said apparatus comprising, in combination:

variable gain means connected to receive and adapted to amplify input audio frequency program signals and produce amplified output signals;

loudness analyzing means operative responsively to said amplified output signals for producing a first control signal for controlling the gain of said variable gain means in accordance with loudness level of the program signals;

signal level analyzing means operative responsively to said amplified output signals for producing a second control signal for controlling the gain of said variable gain means in accordance with the signal level of the program signals and for limiting the amount of gain which can be contributed by said loudness analyzing means; and logic means connected to receive and operative responsively to said first and second control signals for determining which should be in control of said variable gain means and for connecting the appropriate control signal to said variable gain means.

2. Apparatus according to claim 1, wherein said apparatus further comprises:

gain-hold means coupled to said logic means and connected to receive and operative responsively to said input signals for inhibiting gain increases by said variable gain means during program signal lapses or periods of low-level background effects signals.

3. Apparatus according to claim 1 or 2, wherein said loudness analyzing means comprises:

a plurality of bandpass filters all connected to receive said amplified signals for separating the same into a like plurality of predetermined frequency bands;

a like number of rectifying means for individually rectifying the separated signals;

a like number of detection means for individually detecting and scaling the amplitude of the rectified signals to produce a transfer function proportional to an equal loudness contour over the range of loudness levels of sounds represented by said program signals;

means for arithmetically summing the scaled signals to produce a sum signal; and means connected to receive and operative to shape said sum signal to cause the said first control signal to make the response of the apparatus to impulsive sounds, when under control of the first control signal, approximately the same as the response of the human hearing process to impulsive sounds.

4. Apparatus according to claim 3, wherein the loudness analyzing means has a transfer function proportional to a 70 phon equal loudness contour representative of the loudness levels of broadcasting sounds as a function of frequency and intensity over a range of pressure levels from about 60 db to about 80 db.

5. Apparatus according to claim 3, wherein said filters separate the amplified signals into frequency bands of from about 50 to 250 Hz, 250 to 500 Hz, 500 to 1000 Hz, 1.0 to 1.7 KHz, 1.7 to 2.7 KHz, 2.7–4.4 KHz, 4.4–7.7 KHz and 7.7 to 15 KHz, respectively.

6. Apparatus according to claim 3, wherein said variable gain means comprises a voltage controlled amplifier responsive to the said first and second control signals for controlling the gain thereof.

7. Apparatus according to claim 3, wherein the loudness analyzing means further comprises circuit means interposed between the summing means and the signal shaping means for establishing a threshold level above which the loudness analyzing means is operative.

8. Apparatus according to claim 7, wherein said signal shaping means comprises a time constant circuit having a predetermined attack time and automatically selectable first and second release times dependent on the content of the program signals, the first release time normally being relatively slow and the second release time being relatively fast for quickly increasing the amplitude of the first control signal and to thereby quickly increase the gain of said variable gain means in response to a sudden drop in the loudness level of the program signals.

* * * * *